(12) United States Patent
Sharifi Tehrani et al.

(10) Patent No.: US 11,361,831 B2
(45) Date of Patent: Jun. 14, 2022

(54) PROACTIVE READ DISTURB MITIGATION

(71) Applicant: Micron Technology, Inc., Boise, ID (US)

(72) Inventors: Saeed Sharifi Tehrani, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 16/846,974

(22) Filed: Apr. 13, 2020

(65) Prior Publication Data

US 2021/0319834 A1 Oct. 14, 2021

(51) Int. Cl.
| | |
|---|---|
| *G11C 11/34* | (2006.01) |
| *G11C 16/26* | (2006.01) |
| *G11C 29/52* | (2006.01) |
| *G11C 7/10* | (2006.01) |
| *G11C 29/42* | (2006.01) |
| *G11C 16/34* | (2006.01) |
| *G11C 7/04* | (2006.01) |

(52) U.S. Cl.
CPC ............... *G11C 16/26* (2013.01); *G11C 7/04* (2013.01); *G11C 7/1045* (2013.01); *G11C 7/1072* (2013.01); *G11C 16/3404* (2013.01); *G11C 29/42* (2013.01); *G11C 29/52* (2013.01); *G11C 2207/2254* (2013.01)

(58) Field of Classification Search
CPC .......... G11C 16/26; G11C 7/04; G11C 7/1045
USPC ...................................................... 365/185.09
See application file for complete search history.

(56) References Cited

U.S. PATENT DOCUMENTS

| | | | |
|---|---|---|---|
| 2015/0161036 A1* | 6/2015 | Camp | G06F 12/0646 |
| | | | 711/103 |
| 2016/0124679 A1* | 5/2016 | Huang | G06F 3/0647 |
| | | | 711/103 |

\* cited by examiner

*Primary Examiner* — Vu A Le
(74) *Attorney, Agent, or Firm* — Lowenstein Sandler LLP

(57) ABSTRACT

A request is received to perform a set of read operations using a memory device. The set of read operations are divided into a plurality of subsets of read operations. A first read operation is selected from a first subset of read operations of the plurality of subsets of read operations. The first read operation is performed on a first location on a memory device. One or more first data integrity scan operations is performed on one or more second locations on the memory device adjacent to the first location to determine one or more first reliability statistics associated with the one or more second locations.

20 Claims, 6 Drawing Sheets

PROACTIVE READ DISTURB MITIGATION

TECHNICAL FIELD

Embodiments of the disclosure relate generally to memory sub-systems, and more specifically, relate to performing proactive read disturb mitigation in memory sub-systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
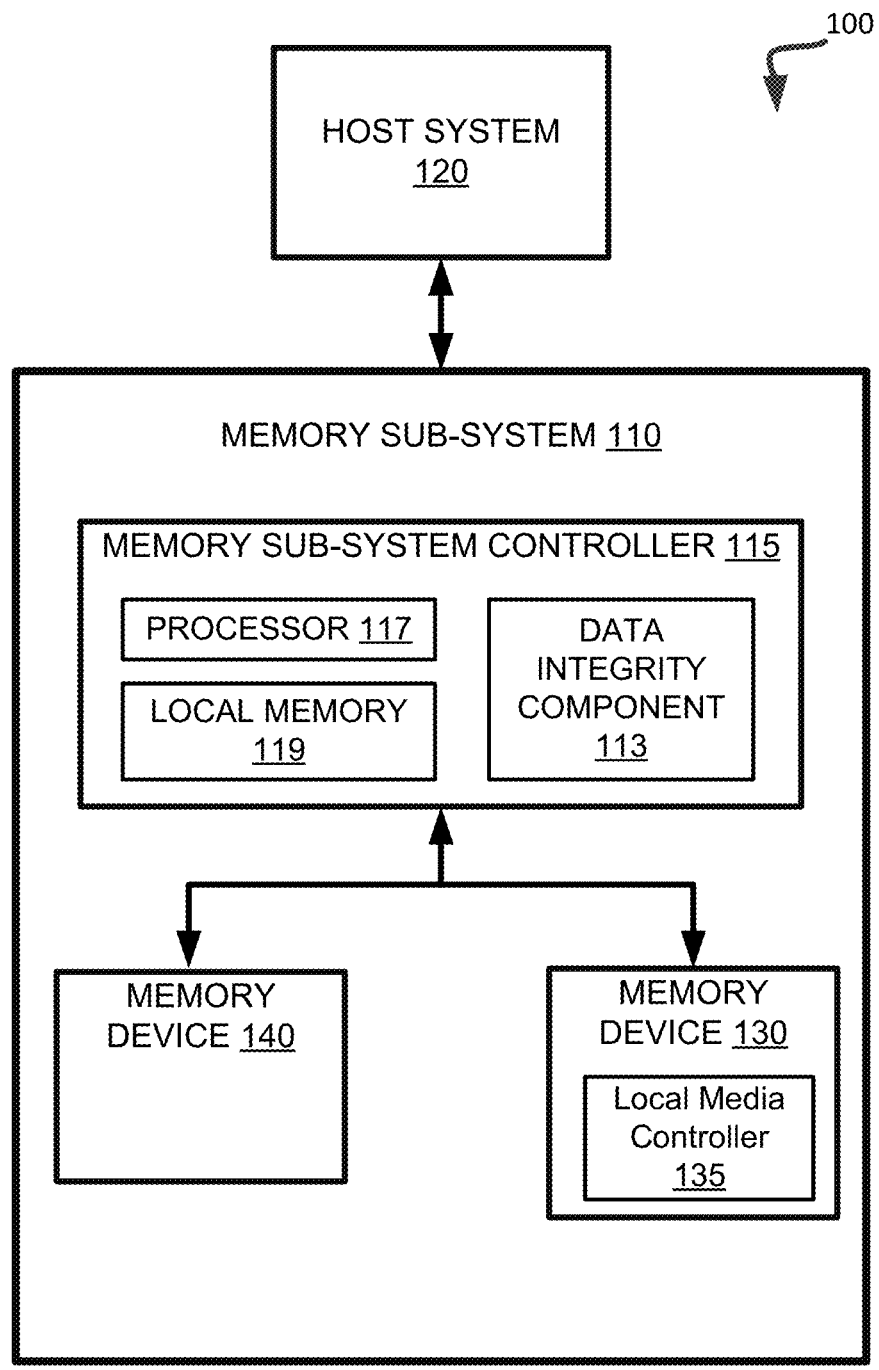
FIG. 1 illustrates an example computing system that includes a memory sub-system in accordance with some embodiments of the present disclosure.

Aspects of the present disclosure are directed to performing write operations to perform proactive read disturb mitigation in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A memory device can be a non-volatile memory device. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory cells that can perform bit storage based on a change of bulk resistance, in conjunction with a stackable cross-gridded data access array. Another example of a non-volatile memory device is a negative- and (NAND) memory device. Other examples of non-volatile memory devices are described below in conjunction with FIG. 1.

Each die of the memory device can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A data block hereinafter refers to a unit of the memory device used to store data and can include a group of memory cells, a word line group, a word line, or individual memory cells. Memory pages (also referred to herein as "pages") store one or more bits of binary data corresponding to data received from the host system. The memory cells of a data block can be arranged along a number of separate wordlines.

Data stored at the memory cells of the memory device can be read from the memory component and transmitted to a host system. When data is read from a memory cell on a given wordline of the memory device, the memory cells on all of the other wordlines on the memory device can experience what is known as "read disturb." Read disturb (RD) is the result of continually reading from memory cells without intervening erase operations, causing other memory cells on other nearby wordlines to change over time. The memory cells of each wordline of the memory device can handle a certain number of consecutive read operations before the memory cells are no longer able to reliably retrieve the data, reaching an RD capability limit (e.g., a threshold number of read operation limit at which point retrieved data is no longer reliable). In some examples, RD capability can reduce as program/erase cycle (PEC) of the memory device increases. In some examples, RD capability can be higher for full blocks than partial blocks. Also, RD capability for certain types of NAND devices can be higher than certain other types. If too many read operations are performed on the memory cells of a given wordline, data stored at memory cells of nearby or adjacent wordlines of the memory device can become corrupted or incorrectly stored at the memory cell. This can result in a higher error rate of the data stored at the memory cells and can increase the use of an error detection and correction operation (e.g., an error control operation) for subsequent operations (e.g., read and/or write) performed on the memory cells. The increased use of the error control operation can result in a reduction of the performance of a conventional memory sub-system. In addition, as the error rate for a memory cell or data block continues to increase, it may even surpass the error correction capabilities of the memory sub-system, leading to an irreparable loss of the data. Furthermore, as more resources of the memory sub-system are used to perform the error control operation, fewer resources can be used to perform other read operations or write operations.

Read disturb can induce a non-uniform stress on memory cells of the data block if memory cells on a particular wordline are read from more frequently. For example, memory cells of a data block that are adjacent to a wordline on which memory cells are frequently read from can have a high error rate, while memory cells that are not adjacent to that wordline can have a lower error rate due to a reduced impact by read disturb on these memory cells. Thus, the effects of read disturb are worse on wordlines that are adjacent to the wordline on which a read operation is performed than on other wordlines located further away. Generally, the highest error rate usually occurs in two immediate neighbor wordlines (also referred to as "victim wordlines" or "VWLs") of the wordline on which a read operation is performed.

Depending on the data access activity of the host system for a particular memory sub-system, the effects of read disturb can be either focused on one or more particular memory pages in a block or distributed more evenly across all the memory pages of the block. If read stress is focused on a single memory page, for example, the block can be considered to be experiencing single word line (SWL) read disturb (also referred to as "row hammer" stress). SWL read disturb can occur in situations where a certain piece of data stored in the memory sub-system is read significantly more often than the rest of the data in the same block. If the read stress is uniformly distributed across multiple memory pages, however, the block can be considered to be experiencing uniform read disturb (also referred to as "full block" read disturb). Uniform read disturb can occur in situations where each piece of data in a block is read with approximately the same frequency (e.g., for a block storing data of a video file, where playback of the video file will trigger a read of each page of that block). A workload received from the host system can include a combination of different read patterns or usage models.

Regardless of the usage model, in order to eliminate the risk of data loss, read operations on the memory device are to be managed such that RD capability limits are not exceeded. The memory sub-system can perform a data integrity check (also referred to herein as a "scan" or "scan operation") to verify that the data stored at the data block has errors within an acceptable limit (e.g., below the RD capability limit, etc.) defined for the memory sub-system. During the data integrity check, one or more reliability statistics are determined for data stored at the data block by performing a read operation. One example of a reliability statistic is raw bit error rate (RBER). The RBER corresponds to a number of bit errors per sample size (e.g., per page or per code word) that the data stored at the data block experiences. If the reliability statistic indicates a high error rate associated with data stored at the data block due, at least in part, to read disturb, then the data stored at the data block can be relocated to a new data block of the memory sub-system (also referred to herein as "folding"). The folding of the data stored at the data block to the other data block can include writing the data to the other data block to refresh the data stored by the memory sub-system. This can be done to negate the effects of read disturb associated with the data and to erase the data at the data block.

A conventional memory sub-system performs a data integrity check at the block level using the data integrity scan operation. Since scan operations are performed at the block level, the memory sub-system monitors the number of read operations performed on a particular data block and performs a scan operation when the read count (i.e., the number of read operations) meets or exceeds a certain read threshold. Depending on the implementation, the memory sub-system can maintain a read counter or multiple read counters that track the number of read operations performed on segments of the memory device. For example, some systems can maintain a separate read counter for each physical block, while other systems can maintain a read counter for a super block (i.e., a collection of multiple physical blocks). In an example where a memory device has 256 dice and 2880 blocks in each die, the system can maintain 737,280 counters, that can occupy approximately 2.81 MB memory space if each counter is 32 bit in size, in order to track read operations at a data block level (e.g., for every data block). The counters are generally implemented in volatile memory (e.g., RAM) to be accessed and updated frequently, at least every few read operations (e.g., every 16 read operations). The state and content of the counters are also saved and loaded between power cycles. In many cases, the available memory space (e.g., RAM) is insufficient to support the use of read counters for each individual wordline of a memory block. The memory sub-system controller firmware generally cannot distinguish between SWL read disturb stress and uniform read disturb stress, so it utilizes a conservative read threshold set based on SWL read disturb stress. Even then, since the count of read operations is maintained at the block level, the memory sub-system controller has no way to tell which wordlines of the data block are, or may be, experiencing the SWL read disturb and, thus, performs the scan operation on every wordline of the data block. The scan operation can include reading one page per wordline in each block to identify the worst RBER and to decide whether folding is to be performed. As such, in an example where the data block has 100 wordlines, at least 100 read operations are performed. This is often more than what is necessary since the data block may simply be experiencing uniform read disturb stress, and even if SWL read disturb stress is present, it is likely that only a small percentage of wordlines in the data block are affected. Thus, performing scans in this manner can result in the performance of excessive memory management operations by the memory sub-system. This can result in a decrease of performance of the memory sub-system, as well as an increase of the power consumption of the memory sub-system. Tracking counters at a block level and/or performing scans on every wordlines is also resource intensive, as described above. System bandwidth and other resources are also tied up for extended periods of time, preventing the use of those resources for other functionality.

Aspects of the present disclosure address the above and other deficiencies by performing proactive read disturb mitigation. When the memory sub-system receives a workload from the host system including read and write requests, a data integrity component proactively performs a read disturb mitigation operation by randomly selecting a read operation for a given subset of read operations from the workload and performing a data integrity scan on wordlines involving the read operation to determine whether folding is to be performed. Instead of performing a scan for each wordline, the data integrity component scans a limited number of wordlines associated with one read operation out of a number of read operations. Instead of tracking counters for each data block, the data integrity component can track one counter for each die, which includes multiple data blocks, as the same counter can be used for a subset of consecutive read operations, and after read operations in a current subset are completed, the counter can be reset and reused for the next subset of read operations. As the memory sub-system receives the workload, the data integrity component divides the read operations in the workload into subset of read operations (also referred to as "windows" herein). The data integrity component selects a random read operation from a current subset of read operations. To select the random read operation, the data integrity component tracks a count of read operations, using a counter, as the read operations are performed within a current subset of read operations ("current subset"). The data integrity component generates a random number for the current subset, and when the counter reaches the random number after performing a particular read operation in the current subset, the data integrity component selects the particular counter as the random read operation for the subset. The random read operation is performed on a particular wordline. The data integrity component performs a data integrity scan on wordlines involving the random read operation. That is, the scan is performed on two adjacent wordlines, or victim wordlines, of the particular wordline to determine error rates associated with the victim wordlines. The scan therefore involves two read operations. If at least one error rate out of the two error rates associated with the two victim wordlines exceeds a threshold criterion, the data integrity component determines that a folding operation is to be performed to migrate data stored on the data block, or on a portion of the data block, to another data block on the memory device. Also, once the counter exceeds the total number of read operations in the current subset, the counter is reset and can be reused for the next subset. The data integrity component proceeds to perform the proactive read disturb mitigation on the next subset of read operation, using the counter and selecting a new random read operation within the next subset.

Advantages of the present disclosure include, but are not limited to, an increased increasing performance and reliability of data stored at the memory sub-system, decreasing power consumption and freeing system resources for other functionality. Since the effects of read disturb stress on the data stored in the adjacent wordlines is mitigated, the number of errors found in data stored at the memory sub-system is reduced. The reduced error rate associated with the data stored at the nearby memory cells can decrease the number of error correction operations that are performed by the memory sub-system and improve the performance of the memory sub-system. By performing the data integrity scan for a limited number of wordlines associated with one read operation out of a subset of read operations, the number of wordlines scanned is reduced significantly. Eliminating usage of one counter per block reduces computing resources used for the scans. Since less computing resources and time are being dedicated by eliminating performing excessive data scans and error correction operations, the computing resources and time can be used to perform other operations (e.g., host access operations) and the capacity of the memory sub-system to store data from the host system is increased. These benefits may be amplified when higher density memory is used (e.g., QLC memory which has a smaller read disturb capability) or as the size of data blocks, and correspondingly the number of wordlines contained therein, increases. This results in an improvement in the performance of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transitorrandom-access memory (FeTRAM), ferroelectric random access memory (FeRAIVI), magneto random access memory (MRAM), Spin Transfer Torque (STT)-MRAM, conductive bridging RAM (CBRAM), resistive random access memory (RRAM), oxide based RRAM (OxRAIVI), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a data integrity component 113 that can be used to perform a proactive read disturb mitigation during performing read operations on the data blocks of memory device 130 and 140. In some embodiments, the memory sub-system controller 115 includes at least a portion of the data integrity component 113. For example, the memory sub-system controller 115 can include a processor 117 (processing device) configured to execute instructions stored in local memory 119 for performing the operations described herein. In some embodiments, the data integrity component 113 is part of the host system 110, an application, or an operating system.

In one embodiment, the data integrity component 113 receives a set of read operations and divide the set into a subsets of read operations. The data integrity component 113 selects a first read operation from a first (e.g., current) subset of read operations of the subsets of read operations, where the first read operation is performed on a first location (e.g., a wordline, a memory cell, etc.) on a memory device 130, for example. The data integrity component 113 performs one or more first data integrity scan operations on one or more second locations on the memory device adjacent to the first location to determine one or more first reliability statistics (e.g, error rate) associated with the one or more second locations. If at least one of the one or more first reliability statistic satisfies a first threshold criterion, the data integrity component 113 can migrate the data stored in the data block comprising the first and second locations to another data block on memory device 130 and reset the read counter for a second (e.g., next) subset of read operations. Further details with regards to the operations of the data integrity component 113 are described below.

Figure 2:
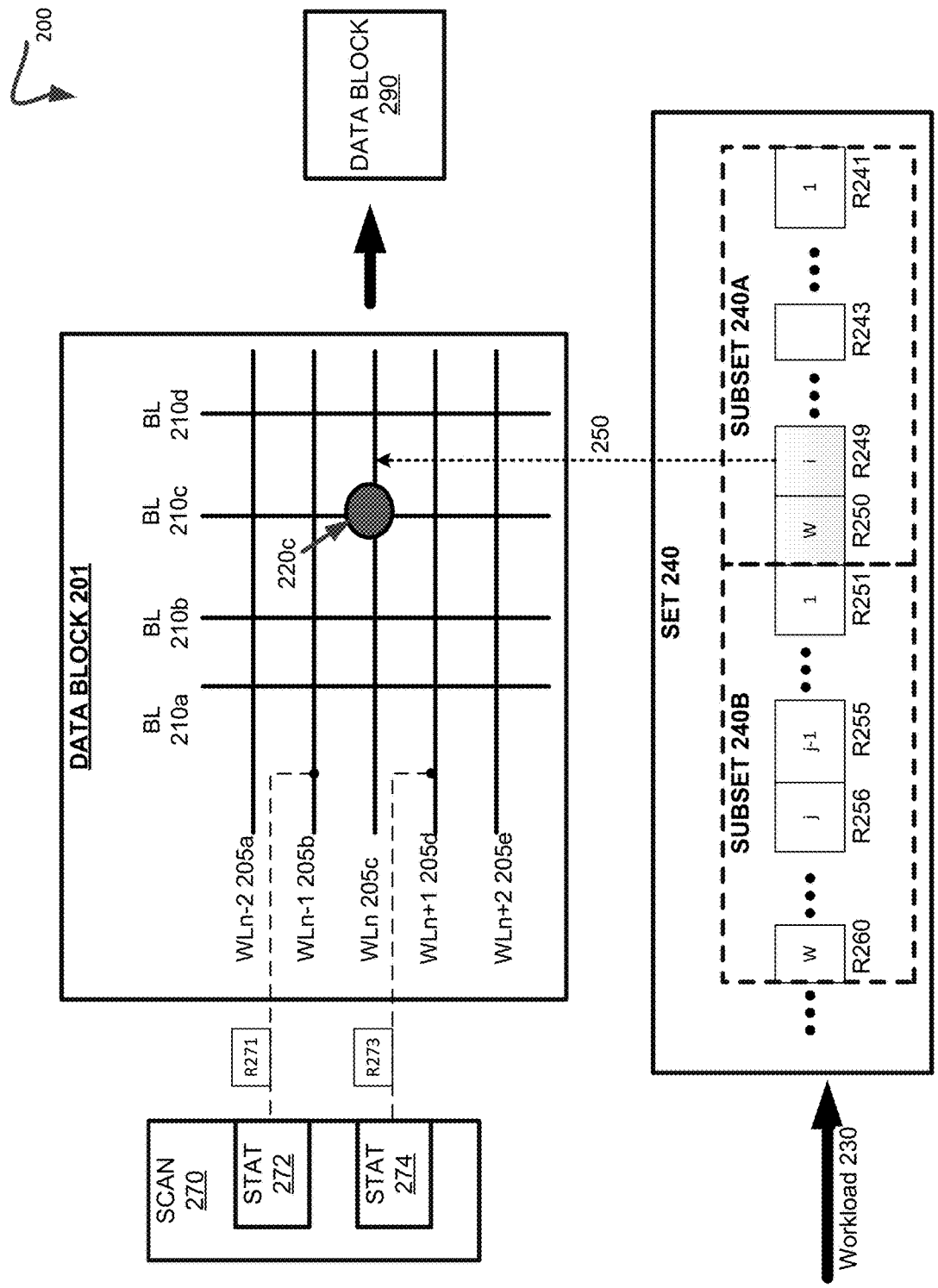
FIG. 2 depicts an example of performing proactive read disturb mitigation, in accordance with some embodiments of the present disclosure.

FIG. 2 depicts an example of performing proactive read disturb mitigation in a memory device 200, in accordance with some embodiments of the present disclosure. In one embodiment, memory device 200 includes a data block 201. Data block 201 is representative of any of the data blocks that make up memory device 130 or memory device 140. As illustrated, data block 201 includes a number of separate wordlines, such as wordlines 205a-f (WLn−2, WLn−1, WLn, WLn+1, WLn+2). Memory cells, such as the memory cell at location 220c, are located at the intersection of each of word lines 205a-e and bit lines 210a-d. This number and arrangement of wordlines and bitlines is merely one example, and in other embodiments, data block 201 may include any other number of wordlines (such as tens of wordlines or hundreds of wordlines).

During a memory access operation, such as a read operation, read disturb (RD) stress can affect data stored at memory cells of a wordline (e.g., victim wordline) that are adjacent to the memory cells of the wordline where the read operation was performed. For example, when data from a memory cell arranged on a certain wordline (e.g., WLn) is read repeatedly, the two adjacent wordlines to WLn, wordlines WLn+1 and WLn−1, experiences highest stress from the read operation on WLn. Adjacent wordlines can include wordlines that are proximate, nearby, neighboring, contiguous, etc., to each other. Additionally, while in some examples, an adjacent wordline to WLn can include a wordline immediately next to WLn, in other examples, an adjacent wordline to WLn can include a wordline that is not the immediately next to the WLn. Whether a wordline is considered an adjacent wordline can depend on the specific technological implementation of the memory sub-system and dimension of the array layout.

Accordingly, in one embodiment, data integrity component 113 can perform proactive read disturb mitigation for memory device 200. In an embodiment of the present disclosure, the memory device 200 can receive a request to perform a set of read operations using the memory device. In some examples, the host system 120 sends a workload stream 230 that includes read requests and write requests. Data integrity component 113 can obtain the set of read operations 240 ("set 240") included in the read requests in the workload stream 230. The set of read operations 240 is directed to the physical address layer, e.g., a die in the memory device 200. The set of read operations 240 includes read operations R241-R260, and beyond. In an example, each read operation can be 4 KB in size. In another example, the read operations can be of different sizes.

In an implementation, data integrity component 113 can divide (e.g., partition) the set 240 of read operations into multiple subsets, or windows, of read operations. In one example, as shown, the set 240 is separated into several windows, including a subset 240A and a subset 240B of read operations. In an example, the read operations are consecutive and non-overlapping. That is, a particular read operation is included only in one window, or subset of read operations.

In some examples, a number of read operations included in each subset (e.g., subset 240A) of the multiple subsets of read operations is same for all of the subsets (e.g., 240A, 240B, etc.) of read operations. In one example, the number of read operations included in each window (e.g., subset 240A, 240B, etc.) can be equal to "W" read operations. For example, W can be set to 10K. That is, the first window, subset 240A, includes 10K read operations (e.g., read operation 1 through read operation 10,000 of set 240), the second window, subset 240B, includes 10K read operations (e.g., read operation 10,001 through read operation 20,000 of set 240), and so on. In one example, the number of read operations is modifiable. For example, the number can be modified from 10K to 5K, which means that after the modification, the first window would include read operation 1 through read operation 5,000 and the second window would include read operations 5,001 through 10,000, and so on. The number of read operations for each window for performing the proactive RD mitigation algorithm (also referred to as "the algorithm" herein) can be selected or modified based on the particular type of memory device used, at what point of the workload stream is the algorithm being performed, the life (e.g., age) of the memory device, etc. In an embodiment, a total size of read operations for each window can be specified instead of, or in addition to, specifying the number of read operations in the window. For example, the window size can be 40 MB, that is, the total size of the read operations included in the window equals to 40 MB.

In an embodiment, data integrity component 113 can select a first read operation from a first subset (e.g., a current subset that the algorithm handles) of the multiple subsets of read operations. For example, read operation R249 (e.g., a current subset that the algorithm handles) can be selected from the subset 240A as the first read operation. The first read operation can be selected randomly from the first subset of read operations.

In an embodiment, to select a random read operation from the subset, data integrity component 113 can use a counter for each die of the memory device 200. The data integrity component 113 can maintain a counter to track a count (e.g., number) of read operations performed within each subset of read operations, such as, subset 240A. In one embodiment, the counter is maintained at the die level, it starts at the value "1" when the first read operation R241 of the first window (e.g., subset 240A) is performed, and is incremented each time a read operation of the first subset 240A is performed.

In an example, data integrity component 113 can generate a uniform random number "u" for each of the subsets of the read operations as the algorithm moves through each subset of read operations. In an example, various low-complexity, high-speed uniform random number generators (URNGs) can be suitable for generating the random number. The random number can be a number between 1 and W. That is, the random number "u" is more than or equal to the number "1" and less than or equal to the number of read operations W in a given subset of read operations. In an example, for the current window (e.g., first subset 240A), the random number "u" generated by the data integrity component 113 is equal to "i" while the random number "u" for the next window, subset 240B, is equal to "j." For example, the value of "i" can be 9999, and the value of "j" can be 5400.

After performing each read operation in the first subset 240A, data integrity component 113 can determine whether the counter (e.g., value of the counter at the given point) has reached the uniform random number "u" for the subset 240A. Data integrity component 113 can determine that the counter has reached (e.g., meets or equals to) the uniform random number "u" after performing a particular read operation R249 in the first subset, and can select the particular read operation R249 as the first read operation. For example, if it is determined that the value of counter reached the number "i" after performing the particular read operation R249, then the particular read operation (e.g., the i-th read operation) is selected at the first read operation. In the example where "i" equals to 9999, when the counter reaches 9999 after performing the $9999^{th}$ read operation (R249) in the first window, read operation 9999 (e.g., the $9999^{th}$ read operation of the subset 240A) is selected as the first read operation (e.g., the random read operation) for performing the proactive RD mitigation algorithm.

The first read operation R249 can be performed on a first location on the memory device 200, as shown by arrow 250. In some examples, the first location on the memory device can include one or more memory cells (e.g., 220c, or additional cells), one or more word lines (e.g., wordline WLn 205c, or additional wordlines), a group of word lines, etc.

In an embodiment, data integrity component 113 can perform a first data integrity scan operation 270 on one or more second locations adjacent to the first location (e.g., cell 220c, wordline WLn, etc.) to determine one or more of a first reliability statistics associated with the second locations. In some examples, the second locations on the memory device can include at least one of: one or more of memory cells (e.g., a cell at the intersection of wordline 205b and bit line 210c, and/or wordline 205d and bit line 210c, etc.), one or more of word lines (e.g., wordlines WLn−1 and WLn+1), a group of word lines, etc. The first data integrity scan operation 270 can include two read operations, one read operation R271 on victim wordline WLn−1 to determine a reliability statistic 272 and another read operation R273 on victim wordline WLn+1 to determine a reliability statistic 274. The first data integrity scan operation 270 can include an error detection operation to determine a first reliability statistics. One example of a reliability statistics can be a raw bit error rate (RBER). The RBER (also referred to as "error rate" herein) corresponds to a number of bit errors per sample size (e.g., per page or per code word) that the data stored at the data block experiences. In an example, the RBER for a given wordline can be obtained by determining a maximum RBER from a set of sample memory cells on the given wordline. In an example, the scan 270 can determine that the RBER value for wordline WLn−1 is "390" and the RBER value for wordline WLn+1 is "410."

In one example, data integrity component 113 can determine whether at least one of the one or more first reliability statistics satisfies (e.g., meets or exceeds) a threshold criterion. For example, a threshold criterion can be defined based on various factors. In an example, the threshold criterion can be modifiable. The threshold criterion can be set or modified based on factors, such as, the particular type of memory device used, the point in time of the workload stream when the threshold is being used, the life (e.g., age) of the memory device at the time threshold being used, etc. For example, the threshold criterion corresponding to a first time can be different from the threshold criterion corresponding a second time, where the second time represents an end of life of the memory device 200. As the age of memory device 200 reaches end of life status, the threshold for error can be different, such as lower than an earlier stage. In some examples, the threshold criterion can represent the RD capability limit, or be defined based on the RD capability limit, such as, by considering a margin of RD capability. In the example of FIG. 2, the threshold criterion is defined as "400."

In one example, data integrity component 113 can determine that at least one of the one or more first reliability statistics satisfying the threshold criterion. For example, stat 272 indicates the RBER value to be "390," which is below the threshold criterion of "400" and as such does not satisfy the threshold criterion. However, stat 274 indicates the RBER value to be "410," which is above the threshold criterion of "400" and as such satisfies the threshold criterion. Thus, at least one of the first reliability statistics satisfies the threshold criterion.

Responsive to determining that at least one of the one or more first reliability statistics (e.g., stat 274) satisfying the threshold criterion, the data integrity component 113 can migrate (e.g., fold) data stored on the first data block 201 on the memory device 200 to a second data block 290 on the memory device 200. The first data block 201 can include the first location (e.g., WLn) and the second locations (e.g., WLn and WLn+1). That is, based on the RBER values of victim wordlines of the wordline where the random read operation 249 is performed on, all data stored on the data block 201 containing the wordline performing the random read operation 249 is migrated, or relocated, out of the data block 201. In some examples, another component of memory sub-system 110, such as controller 115, can perform the data migration operation. In an example, responsive to each one of the one or more first reliability statistics not satisfying the threshold criterion (for example, if stat 274 also indicates the RBER value to be below 400, in addition to stat 272 value being below 400), the memory sub-system can continue to perform all of the read operations of the first subset of read operations without migrating data stored on the first data block 201 to any other data block.

In an embodiment, the data integrity component 113 can determine whether the counter exceeds the number of read operations W in the first subset 240A after performing each read operation in the first subset 240A. Responsive to determining that the counter exceeds the number of read operations W (e.g., 10,000) in the first subset 240A, or in other words, that all read operations of the first subset 240A has been performed, the data integrity component 113 resets the counter to an initial value. The counter can be reused for the next window, subset 240B.

The proactive RD mitigation operations can be continued to be performed using the next window, upon all read operations of the first window are completed. Similar to the first window, data integrity component 113 can select a second read operation R256 from a second subset 240B (e.g., next window after the first window) of the multiple subsets of read operations. The second read operation R256 can be randomly selected based on data integrity component 113 generating a random value "u" that is equal to "j" for the second window, subset 240B, and selecting the j-th read operation R2256 from the subset 240B as the second read operation. As described previously, the value of "j" can be 5400 in this example. The second read operation R256 can be performed on a third location on the memory device (not depicted). The data integrity component 113 can perform one or more second data integrity scan operations on one or more fourth locations on the memory device 200 adjacent to the third location to determine one or more second reliability statistics (e.g., RBER) associated with the one or more fourth locations. In one example, data block 201 can include the third location and the fourth locations. In another example, another data block can include the third and fourth locations. The data integrity component 113 can determine whether at least one of the one or more second reliability statistics satisfies the threshold criterion, and responsive to at least one of the one or more second reliability statistics satisfying the threshold criterion, migrate data stored on the first data block 201 (or, the other data block where the third and fourth locations are located) to a third data block on the memory device 200. Similarly, the process can continue for all subsets of read operations of the set of read operations 240.

Figure 3:
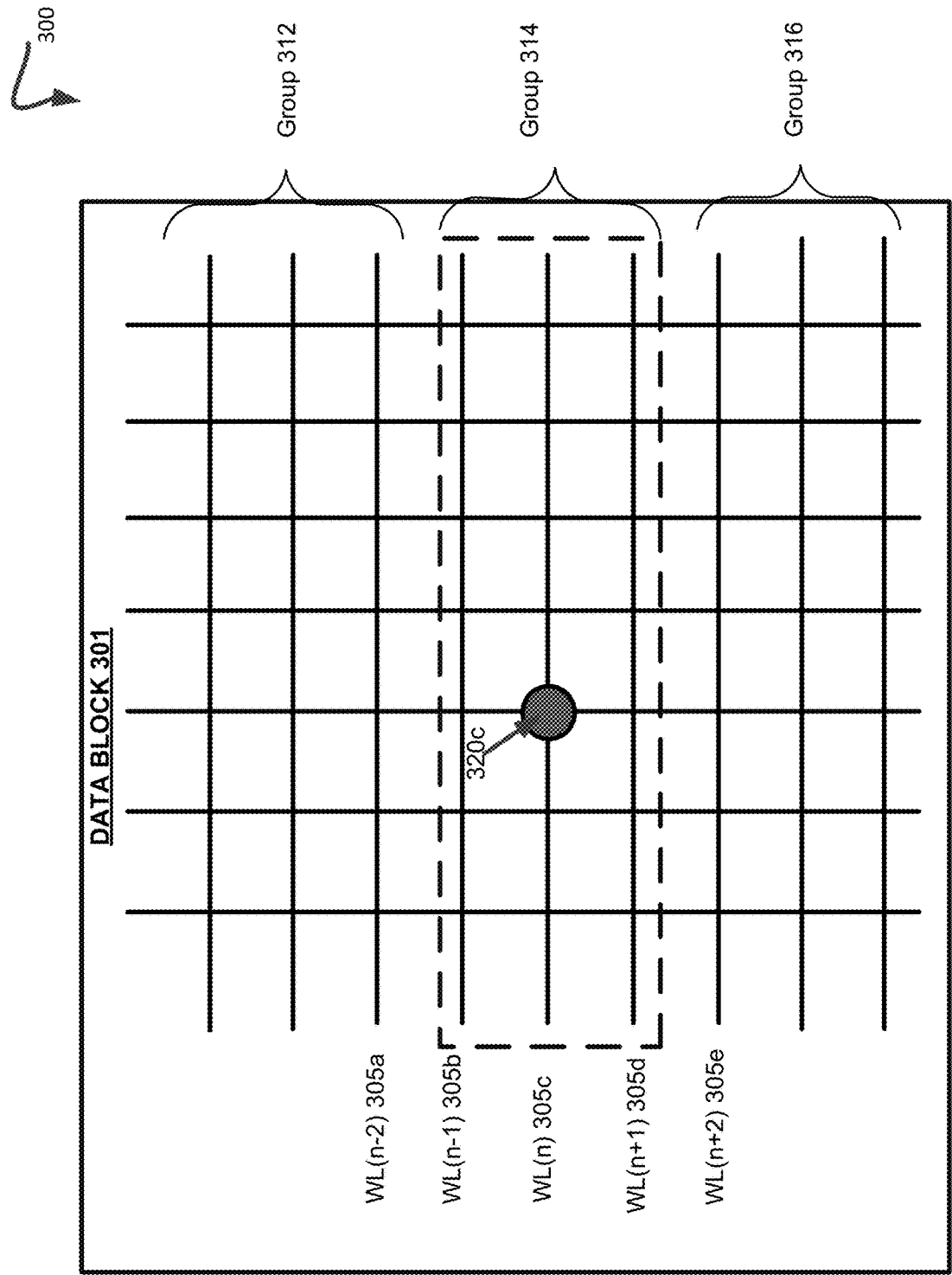
FIG. 3 depicts an illustration of migrating a group of wordlines, in accordance with some embodiments of the present disclosure.

FIG. 3 depicts an illustration of migrating a group of wordlines on a memory device 300, in accordance with some embodiments of the present disclosure. Data block 301 can be similar to data block 201 depicted in FIG. 2. Operations performed with regards to the proactive RD mitigation as described in FIG. 2 can be applicable in the same way to data block 301. In the illustration of FIG. 3, the memory device 300 is depicted as supporting folding operation of an individual wordline, or groups of wordlines of the memory device 300 that represent a portion of the data block 301. Data block 301 can be composed of rows of word lines and columns of bitlines. The rows of word lines can be segmented into groups 312, 314, 316, etc. that each includes three word lines of data block 301. Although the present illustration has groups 312, 314, 316 each including three word lines of data block 301, in embodiments a data block can be segmented into any number of groups that can each include any number of word lines, including a single wordline in a group. Group 314 includes a set of memory cells (such as, cell 320c) that store one or more bits of user data. Group 314 includes wordlines 305b, 305c, and 305d. In the present illustration, group 314 has been identified for migrating to another data block based on a data integrity scan, as previously discussed with respect to the data integrity scan 270 performed on wordlines of data block 201 in FIG. 2. For example, data integrity component 113 can perform the random read operation on a first wordline WLn 305c (similar to WLn 205c in FIG. 2) that is located on a first portion (e.g., group 314) of data block 301. Data integrity component 113 performs an error detection operation (e.g., similar to data integrity scan 270 in FIG. 2) on a second wordline WLn−1 305b and a third wordline WLn+1 305d located on the first portion (e.g., group 314) of the data block 301 to determine an error rate associated with the second wordline and the third wordline. In an example, the second wordline and the third wordline are adjacent to the first wordline. Data integrity component 113 identifies the first portion (e.g., group 314) of the first data block to migrate data from wordlines included in group 314 to a second data block (or, in one example, to the same data block 301) when the error rate satisfies a threshold criterion. Accordingly, data stored at the set of memory cells of on the first portion (e.g., group 314) can be migrated (e.g., folded) to a second portion (e.g., another group of wordlines) on another data block. All data stored in data block 301 need not be migrated in order to migrate the data stored within group 314. In one example, data stored on the first portion of the first data block can be migrated to the second portion of the second data block on the memory device by reading the data stored on the cells of the first portion, group 314, of the first data block, writing the data stored on cells of group 314 to the second data block, and upon writing the data to the second data block, erasing the data stored on the first portion, group 314, of the first data block 301. New data received from a host system can be stored at the set of memory cells of group 314.

Figure 4:
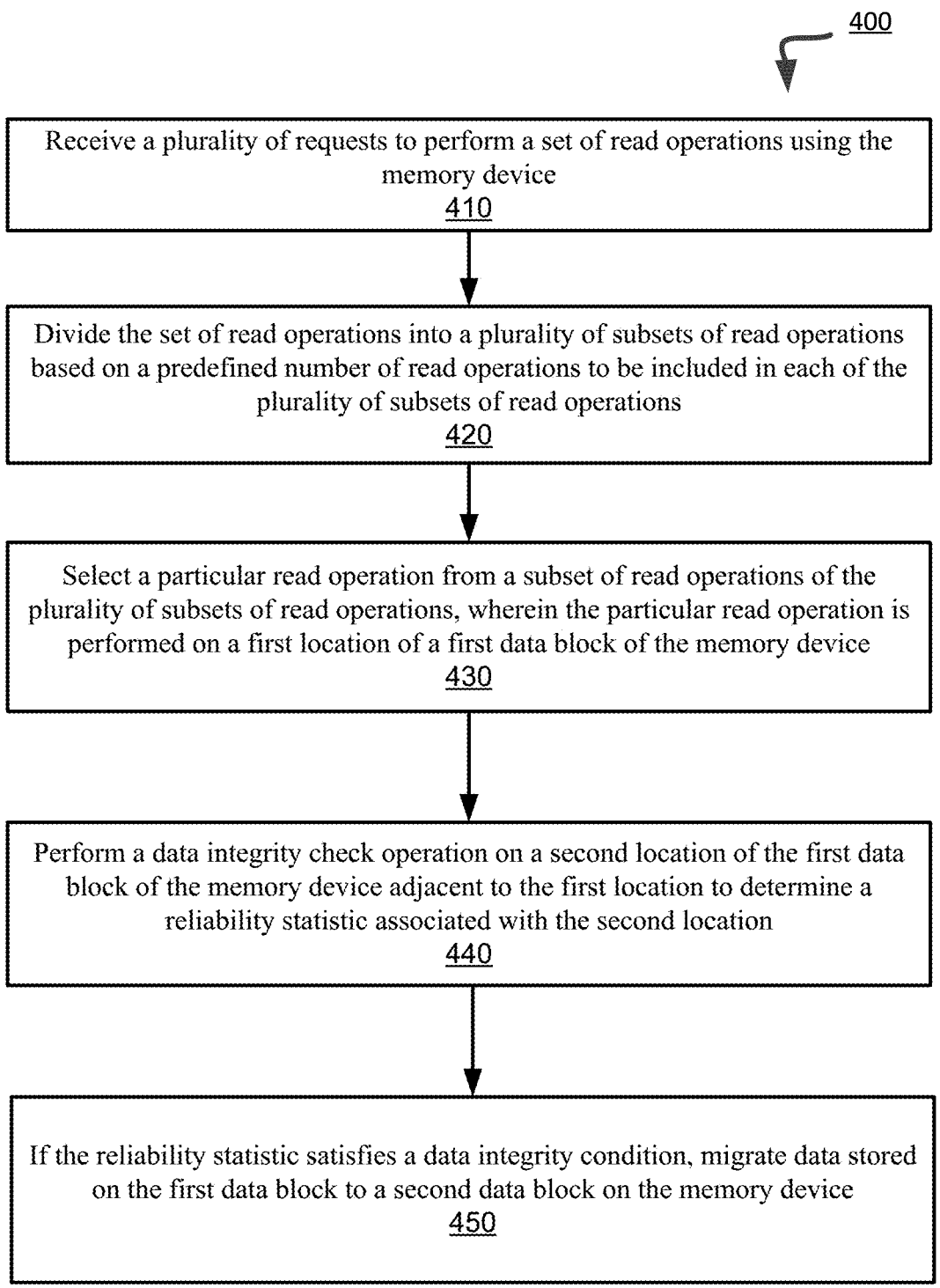
FIG. 4 is a flow diagram of an example method to perform proactive read disturb mitigation, in accordance with some embodiments of the present disclosure.

FIG. 4 is a flow diagram of an example method 400 to perform proactive read disturb mitigation, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data integrity component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a request to perform a set of read operations using the memory device. In some examples, the host system sends a workload stream that includes read requests and write requests. The processing logic can extract the request to perform the set of read operations from the read requests in the workload stream.

At operation 420, the processing logic divides the set of read operations into multiple subsets of read operations. In some examples, a number of read operations included in each subset of the multiple subsets of read operations is same for all of the subsets of read operations. In one example, the number of read operations is modifiable.

At operation 430, the processing logic selects a first read operation from a first subset of the multiple subsets of read operations where the first read operation is performed on a first location. In some example, the processing logic selects the first read operation by randomly selecting the first read operation from the first subset of read operations. In one example, selecting the first read operation comprises: maintaining a counter for each die of the memory device to track a count of read operations performed in the first subset of read operations; generating a uniform random number that is less than or equal to the number of read operations in the first subset; determining whether the counter has reached the uniform random number after performing each read operation in the first subset; and responsive to determining that the counter has reached the uniform random number after performing a particular read operation in the first subset, selecting the particular read operation as the first read operation.

At operation 440, the processing logic performs first data integrity scan operations on second locations on the memory device adjacent to the first location to determine first reliability statistics associated with the second locations. In some examples, the first location and the second locations on the memory device can each comprise at least one of: one or more of a memory cells, a word line, or a group of word lines. In one example, the processing logic can determine whether at least one of the one or more first reliability statistics satisfies a threshold criterion; and responsive to at least one of the one or more first reliability statistics satisfying the threshold criterion, migrate data stored on a first data block on the memory device to a second data block on the memory device, where the first data block includes the first location and the second locations. In an example, the threshold criterion is modifiable. In some examples, the processing logic can determine whether the counter exceeds the number of read operations in the first subset after performing each read operation in the first subset; and responsive to determining that the counter exceeds the number of read operations in the first subset, resets the counter to an initial value. In an example, responsive to each one of the one or more first reliability statistics not satisfying the threshold criterion, the processing logic can continue to perform the first subset of read operations without migrating data stored on the first data block.

Furthermore, the processing logic can select a second read operation from a second subset of the multiple subsets of read operations, wherein the second read operation is performed on a third location on the memory device. The processing logic can perform one or more second data integrity scan operations on one or more fourth locations on the memory device adjacent to the third location to determine one or more second reliability statistics associated with the one or more fourth locations, determine whether at least one of the one or more second reliability statistics satisfies the threshold criterion, and responsive to at least one of the one or more second reliability statistics satisfying the threshold criterion, migrating data stored on the first data block on the memory device to a third data block on the memory device, where the first data block comprising the third location and the one or more fourth locations.

Figure 5:
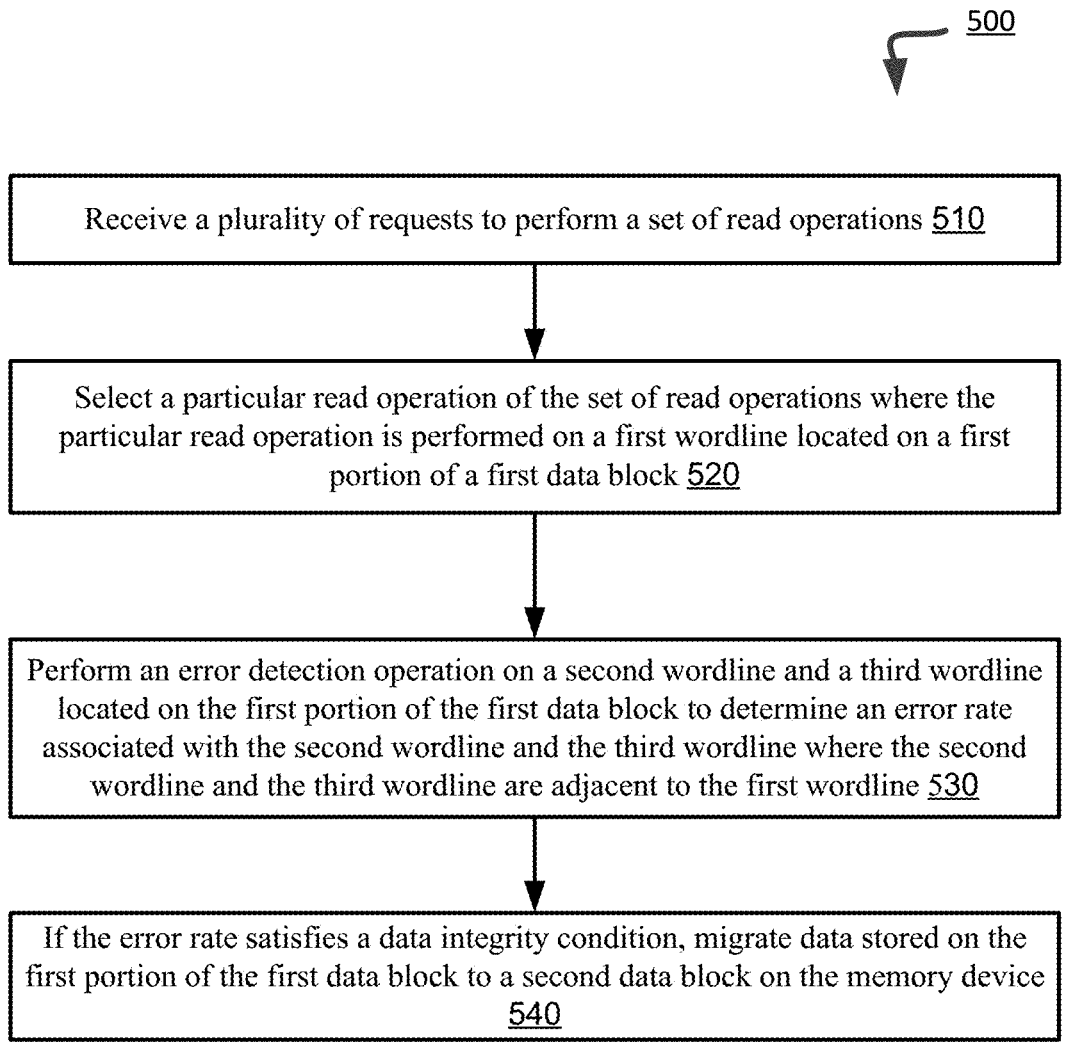
FIG. 5 is a flow diagram of an example method for migrating a group of wordlines to perform proactive read disturb mitigation, in accordance with some embodiments of the present disclosure.

FIG. 5 is a flow diagram of an example method 500 for migrating a group of wordlines to perform proactive read disturb mitigation, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the data integrity component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a request to perform a set of read operations. In some examples, the host system sends a request that includes read and write requests in a workload stream. The processing logic can obtain the set of read operations from the read requests in the workload stream.

At operation 520, the processing logic selects a random read operation of the set of read operations. In an example, the processing logic performs the random read operation on a first wordline located on a first portion of a first data block. In one example, the first portion can include a group of wordlines. In some examples, the random read operation of the set of read operations is selected using a uniform random number.

At operation 530, the processing logic performs an error detection operation on a second wordline and a third wordline located on the first portion of the first data block. The processing logic performs the error detection operation to determine an error rate associated with the second wordline and the third wordline. In an example, the second wordline and the third wordline are adjacent to the first wordline.

At operation 540, the processing logic determines whether the error rate satisfies a threshold criterion. In some examples, the threshold criterion is modifiable. For example, the processing logic can modify the threshold criterion to fit the need of the particular memory device architecture, based on the status of the memory device, etc. In one example, the threshold criterion corresponding to a first time can be different from the threshold criterion corresponding a second time, where the memory device is indicated as having an end of life status at the second time.

At operation 550, the processing logic migrates data stored on the first portion of the first data block to a second data block on the memory device if the error rate satisfies the threshold criterion. In one example, the processing logic can migrate data stored on the first portion of the first data block to the second portion of the second data block on the memory device by reading the data stored on the first portion of the first data block, writing the data to the second data block, and upon writing the data to the second data block, erasing the data stored on the first portion of the first data block.

Figure 6:
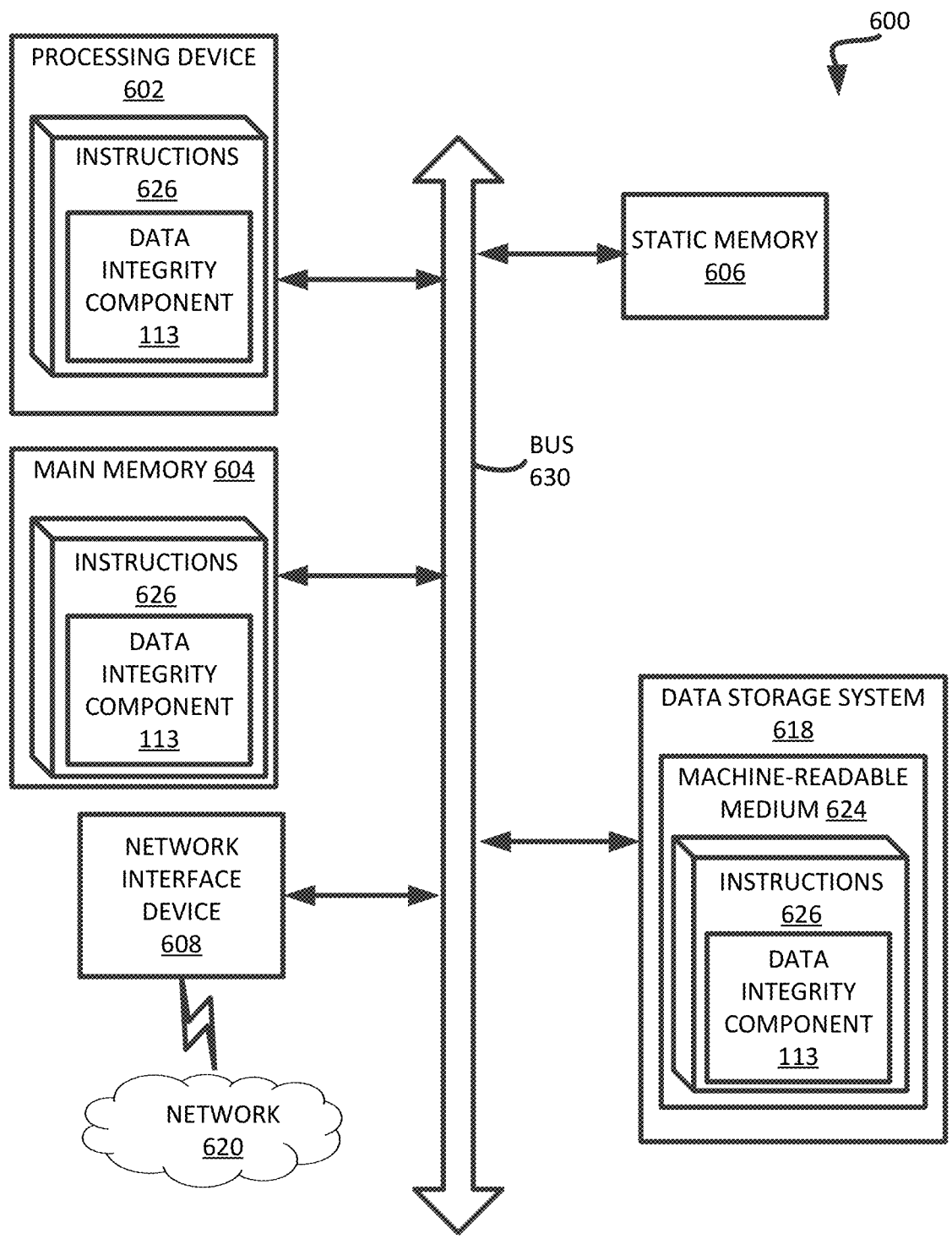
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the data integrity component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data integrity component (e.g., the data integrity component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
 a memory device; and
 a processing device, operatively coupled with the memory device, to perform operations comprising:
  receiving a request to perform a set of read operations using the memory device;
  dividing the set of read operations into a plurality of subsets of read operations;
  selecting a first read operation from a first subset of read operations of the plurality of subsets of read operations, wherein the first read operation is performed on a first location on the memory device; and
  performing one or more first data integrity scan operations on one or more second locations on the memory device adjacent to the first location to determine one or more first reliability statistics associated with the one or more second locations.

2. The system of claim 1, wherein a number of read operations included in each subset of the plurality of subsets of read operations is same for each of the plurality of subsets of read operations.

3. The system of claim 2, wherein the number of read operations is modifiable.

4. The system of claim 1, wherein selecting the first read operation comprises randomly selecting the first read operation from the first subset of read operations.

5. The system of claim 2, wherein selecting the first read operation comprises:
maintaining a counter for each die of the memory device to track a count of read operations performed in the first subset of read operations;
generating a uniform random number that is less than or equal to the number of read operations in the first subset;
determining whether the counter has reached the uniform random number after performing each read operation in the first subset; and
responsive to determining that the counter has reached the uniform random number after performing a particular read operation in the first subset, selecting the particular read operation as the first read operation.

6. The system of claim 5, wherein the processing device to perform further operations comprising:
determining whether the counter exceeds the number of read operations in the first subset after performing each read operation in the first subset; and
responsive to determining that the counter exceeds the number of read operations in the first subset, resetting the counter to an initial value.

7. The system of claim 1, wherein the first location and the one or more second locations on the memory device each comprises at least one of one or more of a memory cells, a word line, or a group of word lines.

8. The system of claim 1, wherein the processing device to perform further operations comprising:
determining whether at least one of the one or more first reliability statistics satisfies a threshold criterion; and
responsive to at least one of the one or more first reliability statistics satisfying the threshold criterion, migrating data stored on a first data block on the memory device to a second data block on the memory device, the first data block comprising the first location and the one or more second locations.

9. The system of claim 8, wherein the threshold criterion is modifiable.

10. The system of claim 8, wherein the processing device to perform further operations comprising:
responsive to each one of the one or more first reliability statistics not satisfying the threshold criterion, continuing to perform the first subset of read operations without migrating data stored on the first data block.

11. The system of claim 8, wherein the processing device to perform further operations comprising:
selecting a second read operation from a second subset of the plurality of subsets of read operations, wherein the second read operation is performed on a third location on the memory device;
performing one or more second data integrity scan operations on one or more fourth locations on the memory device adjacent to the third location to determine one or more second reliability statistics associated with the one or more fourth locations;
determining whether at least one of the one or more second reliability statistics satisfies the threshold criterion; and
responsive to at least one of the one or more second reliability statistics satisfying the threshold criterion, migrating data stored on the first data block on the memory device to a third data block on the memory device, the first data block comprising the third location and the one or more fourth locations.

12. A non-transitory computer-readable storage medium comprising instructions that, when executed by a processing device, cause the processing device to:
receive a request to perform a set of read operations using a memory device;
divide the set of read operations into a plurality of subsets of read operations;
select a first read operation from a first subset of read operations of the plurality of subsets of read operations, wherein the first read operation is performed on a first location on the memory device; and
perform one or more first data integrity scan operations on one or more second locations on the memory device adjacent to the first location to determine one or more first reliability statistics associated with the one or more second locations.

13. The non-transitory computer-readable storage medium of claim 12, wherein a number of read operations included in each subset of the plurality of subsets of read operations is same for each of the plurality of subsets of read operations.

14. The non-transitory computer-readable storage medium of claim 13, wherein the number of read operations is modifiable.

15. The non-transitory computer-readable storage medium of claim 12, wherein to select the first read operation, the processing device is to randomly select the first read operation from the first subset of read operations.

16. A method comprising:
receiving a request to perform a set of read operations using a memory device;
dividing the set of read operations into a plurality of subsets of read operations;
selecting a first read operation from a first subset of read operations of the plurality of subsets of read operations, wherein the first read operation is performed on a first location on the memory device; and
performing one or more first data integrity scan operations on one or more second locations on the memory device adjacent to the first location to determine one or more first reliability statistics associated with the one or more second locations.

17. The method of claim 16, wherein a number of read operations included in each subset of the plurality of subsets of read operations is same for each of the plurality of subsets of read operations.

18. The method of claim 17, wherein the number of read operations is modifiable.

19. The method of claim 16, wherein selecting the first read operation comprises randomly selecting the first read operation from the first subset of read operations.

20. The method of claim 16, wherein selecting the first read operation comprises:
maintaining a counter for each die of the memory device to track a count of read operations performed in the first subset of read operations;

generating a uniform random number that is less than or equal to the number of read operations in the first subset;

determining whether the counter has reached the uniform random number after performing each read operation in the first subset; and responsive to determining that the counter has reached the uniform random number after performing a particular read operation in the first subset, selecting the particular read operation as the first read operation.

* * * * *